(12) United States Patent
Yang et al.

(10) Patent No.: US 11,592,749 B2
(45) Date of Patent: Feb. 28, 2023

(54) LASER INTERFERENCE FRINGE CONTROL FOR HIGHER EUV LIGHT SOURCE AND EUV THROUGHPUT

(71) Applicant: TAIWAN SEMICONDUCTOR MANUFACTURING COMPANY, LTD., Hsinchu (TW)

(72) Inventors: Chansyun David Yang, Hsinchu (TW); Keh-Jeng Chang, Hsinchu (TW); Chan-Lon Yang, Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/504,210

(22) Filed: Oct. 18, 2021

(65) Prior Publication Data

US 2022/0035253 A1 Feb. 3, 2022

Related U.S. Application Data

(63) Continuation of application No. 16/940,351, filed on Jul. 27, 2020, now Pat. No. 11,150,559.

(60) Provisional application No. 62/955,245, filed on Dec. 30, 2019.

(51) Int. Cl.
*G03F 7/00* (2006.01)
*G03F 7/20* (2006.01)

(52) U.S. Cl.
CPC .......... *G03F 7/70033* (2013.01); *G03F 7/702* (2013.01)

(58) Field of Classification Search
CPC .................... G03F 7/70033; G03F 7/702
See application file for complete search history.

(56) References Cited

U.S. PATENT DOCUMENTS

| 8,796,666 | B1 | 8/2014 | Huang et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 9,618,837 | B2 | 4/2017 | Lu et al. |
| 9,869,928 | B2 | 1/2018 | Huang et al. |
| 9,869,934 | B2 | 1/2018 | Huang et al. |
| 9,869,939 | B2 | 1/2018 | Yu et al. |

OTHER PUBLICATIONS

Notice of Allowance issued in U.S. Appl. No. 16/940,351, dated Jun. 21, 2021.

*Primary Examiner* — Nicole M Ippolito
*Assistant Examiner* — Hanway Chang
(74) *Attorney, Agent, or Firm* — McDermott Will & Emery LLP

(57) ABSTRACT

A method for generating an extreme ultraviolet (EUV) radiation includes simultaneously irradiating two or more target droplets with laser light in an EUV radiation source apparatus to produce EUV radiation and collecting and directing the EUV radiation produced from the two or more target droplet by an imaging mirror.

20 Claims, 11 Drawing Sheets

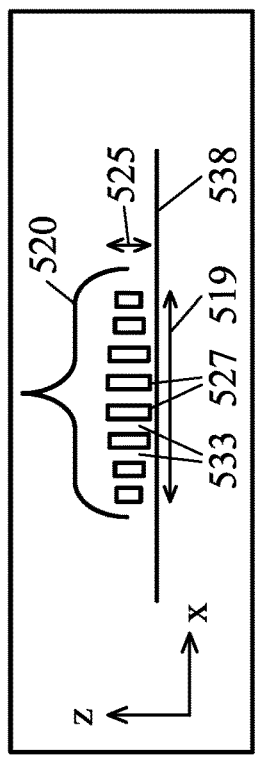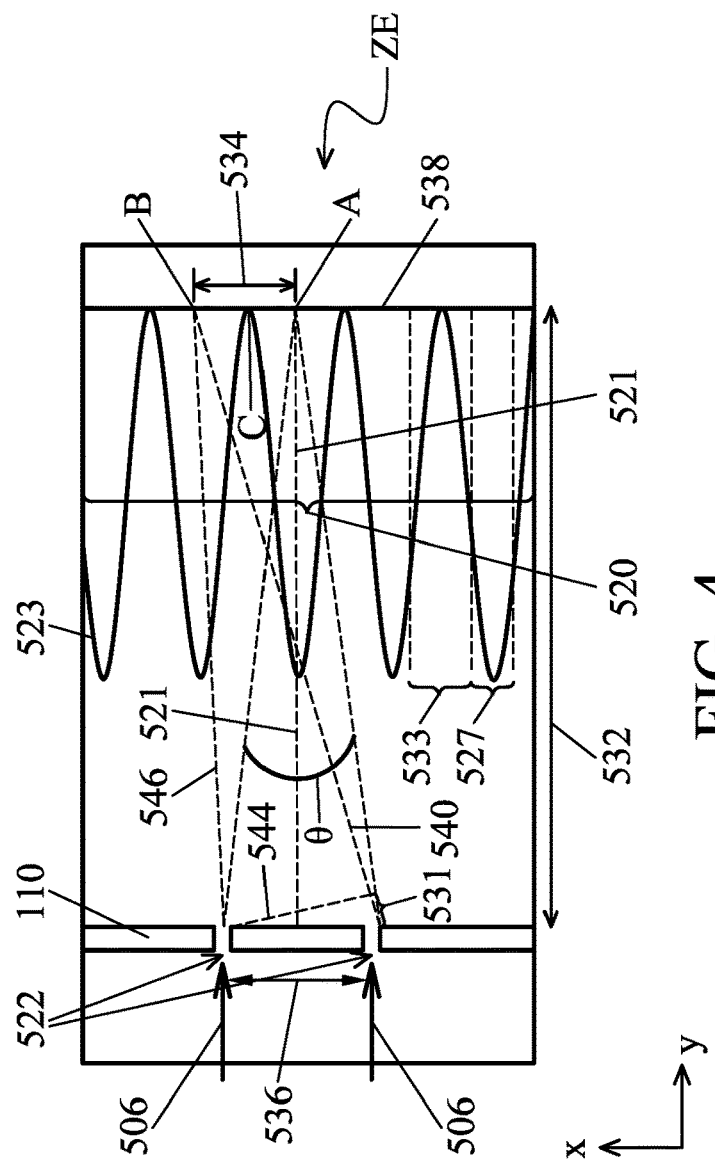
FIG. 5
FIG. 4

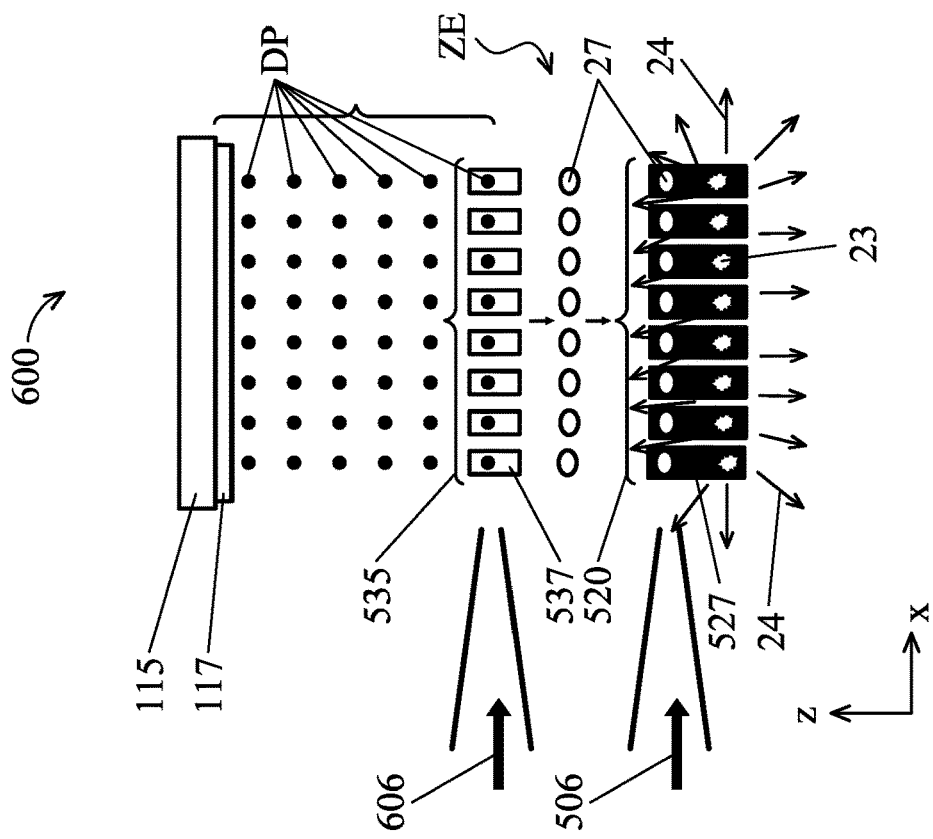
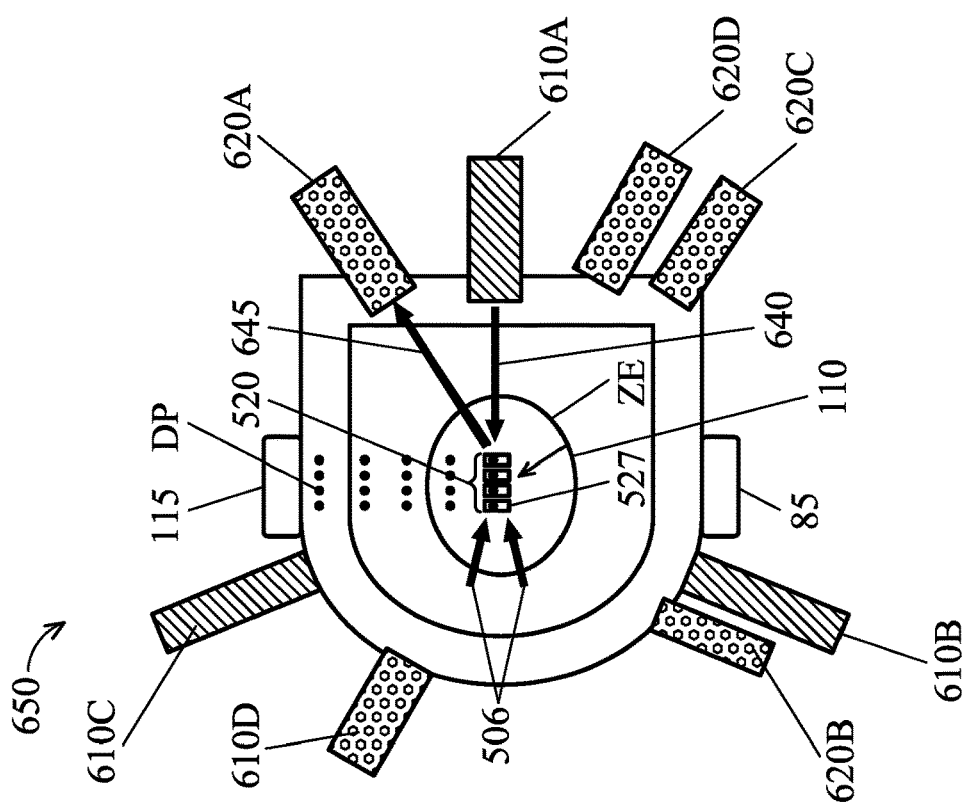
FIG. 6A
FIG. 6B

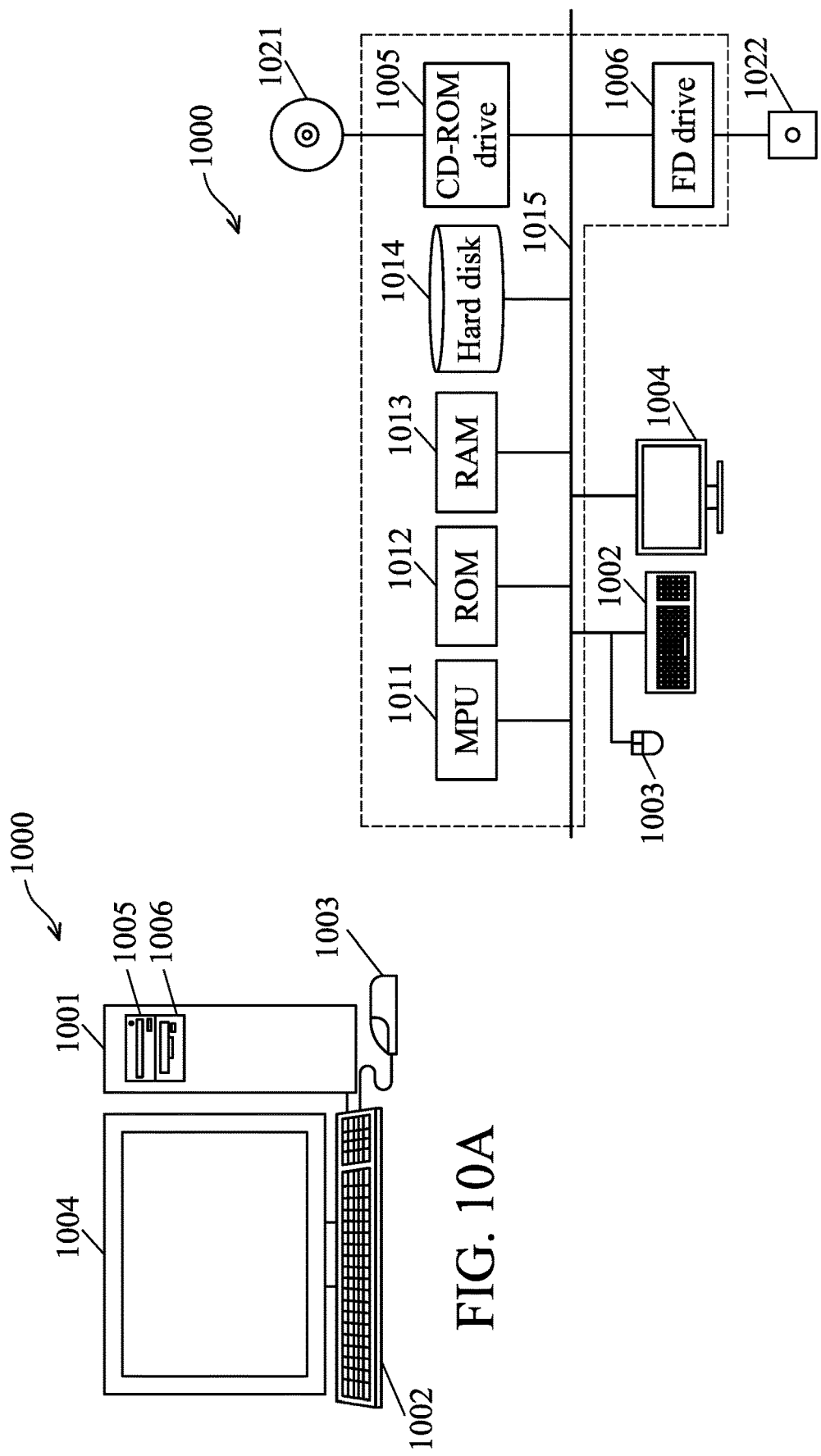

LASER INTERFERENCE FRINGE CONTROL FOR HIGHER EUV LIGHT SOURCE AND EUV THROUGHPUT

PRIORITY CLAIM AND CROSS-REFERENCE

This application is a continuation of U.S. patent application Ser. No. 16/940,351 filed Jul. 27, 2020, now U.S. Pat. No. 11,150,559, which claims priority to U.S. Provisional Application No. 62/955,245 filed on Dec. 30, 2019, entitled "Laser Interference Fringe Control for Higher EUV Light Source and EUV Throughput," the entire disclosure of each of which is incorporated herein by reference.

BACKGROUND

The wavelength of radiation used for lithography in semiconductor manufacturing has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm. One method for producing EUV radiation is laser-produced plasma (LPP). In an LPP-based EUV source, a high-power laser beam is focused on small droplet targets of metal, such as tin, to form a highly ionized plasma that emits EUV radiation with a peak maximum emission at 13.5 nm. It is highly desired to increase the efficiency of the LPP-based EUV source.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 illustrates an optical system of the EUV radiation source for generating a pattern of bright and dark fringes in accordance with some embodiments of the present disclosure.

FIG. 5 illustrates a pattern of bright and dark fringes generated by an optical system in accordance with some embodiments of the present disclosure.

FIGS. 6A and 6B illustrate an EUV radiation source for generating plasma from multiple droplets using multiple fringes in accordance with some embodiments of the present disclosure.

FIGS. 10A and 10B illustrate a computer system for an apparatus for generating EUV radiation from multiple droplets in accordance with some embodiments of the disclosure.

DETAILED DESCRIPTION

Figure 1:
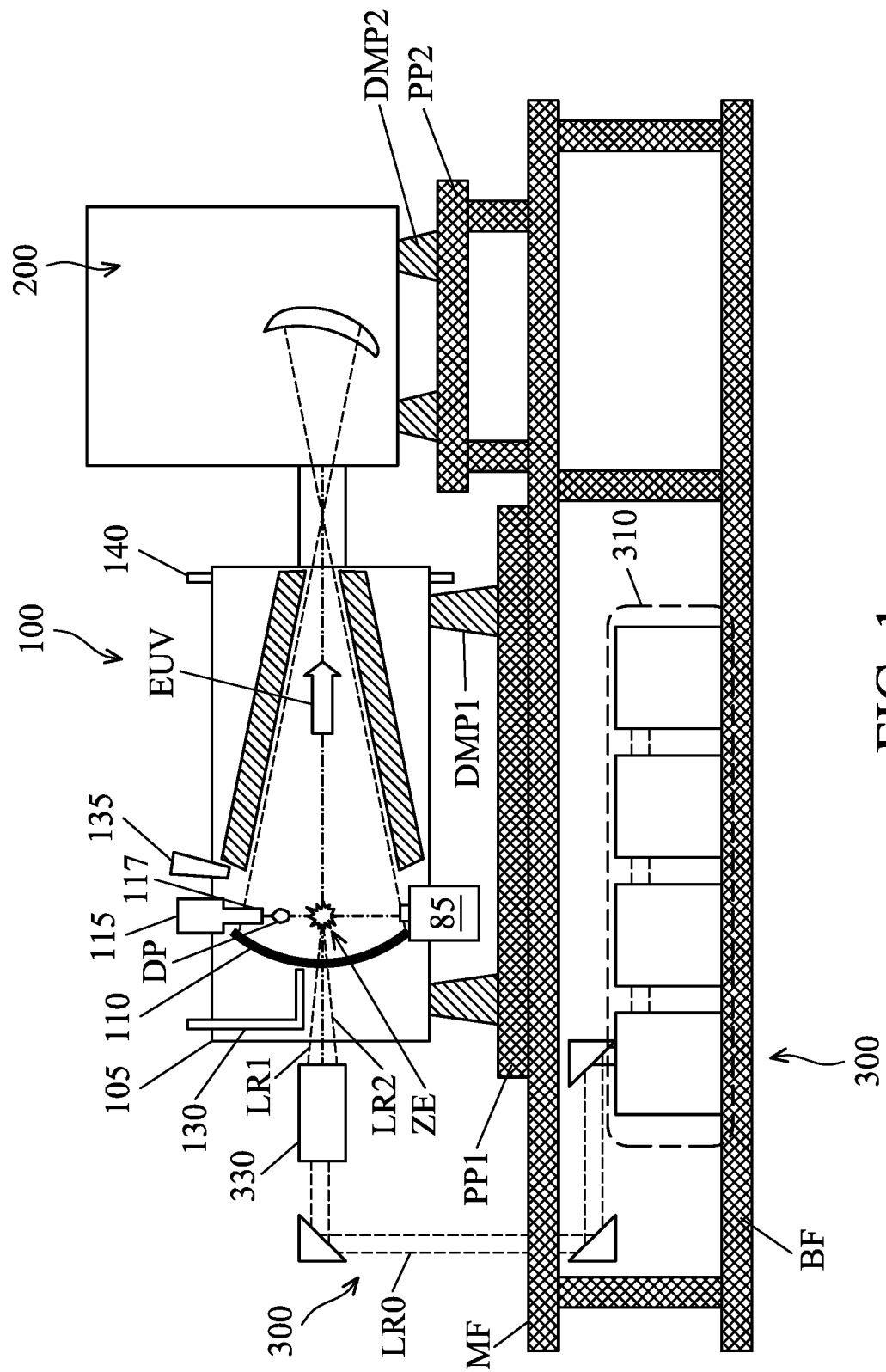
FIG. 1 illustrates a schematic view of an EUV lithography system with a laser produced plasma (LPP) EUV radiation source.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

An EUV radiation source includes a laser source, a collector mirror, a droplet generator, and a droplet catcher. In some embodiments, the droplet generator includes multiple nozzles and simultaneously generates multiple target droplets of 2, 4, 6, 8, or 10 droplets, in parallel. In some embodiments, the multiple number of droplets are smaller in size and thus require less laser energy to be ionized to produce EUV radiation. In some embodiments, the high power laser beam is divided into a plurality of portions, e.g., divided into two, three, or four portions, and are introduced into the EUV radiation source through a plurality of slits, e.g., openings, and from multiple directions, e.g., through two slits, three slits, or four slits, and from two, three, or four directions. The plurality of portions of the laser beam may interfere at a zone of excitation in the EUV radiation source and may create multiple parallel fringes of laser light at the zone of excitation. In some embodiments, the multiple fringes have a width comparable to a width of the smaller droplets and multiple nozzles of the droplet generator exit the droplets such that each droplet travels along one of the multiple parallel fringes. When the droplet passes through, e.g. passes along, each fringe, the laser energy of the fringe may ionize the droplets to produce EUV radiation. Although, the laser energy/power is divided into the multiple fringes and thus the energy/power of each fringe is smaller than when the laser beam is focused on one point, the efficiency of producing the EUV radiation may be higher because a surface area of the multiple smaller droplets is more than the surface area of one large droplet having the size of the combination of the smaller droplets. Thus, more laser energy may be transferred to the smaller droplets compared to an amount of laser energy transferred when focusing the laser beam at one point on the large droplet. In addition, the laser fringes have a length such that smaller droplets pass along the fringe length, and thus, stay under the laser beam for a longer time than when the laser beam is focused on one point on the large droplet and. Thus, the efficiency of producing the EUV radiation may further increase.

FIG. 1 shows a schematic view of an EUV lithography system with a laser-produced plasma (LPP) EUV radiation source. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of LPP to generate the EUV radiation.

The exposure device 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more details with respect to FIG. 2.

In the present disclosure, the terms mask, photomask, and reticle are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure device 200 includes a projection optics module for imaging the pattern of the mask on to a semiconductor substrate with a resist coated thereon secured on a substrate stage of the exposure device 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. A droplet DP that does not interact goes to a droplet catcher 85. The droplet generator 115 generates a plurality of target droplets DP, which are supplied into the chamber 105 through a nozzle 117. In some embodiments, the target droplets DP are metal droplets such as tin (Sn), lithium (Li), or an alloy of Sn and Li. Although not shown in the cross-sectional view of FIG. 1, the droplet generator 115 generates multiple target droplets DP simultaneously and in parallel in some embodiments. In some embodiments, as will be described with respect to FIGS. 6A and 6B, the nozzle 117 of the droplet generator 115 has multiple openings that generates multiple target droplets DP in parallel, e.g., parallel target droplets DP. In some embodiments, the target droplets DP each have a diameter in a range from about 10 microns (μm) to about 50 μm. For example, in an embodiment, the target droplets DP are tin droplets, each having a diameter of about 10 μm to about 22 μm. In some embodiments, the target droplets DP are supplied through the multiple openings of the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the multiple openings of the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds. Although not shown in the cross-sectional view of FIG. 1, the droplet catcher 85 receives multiple parallel droplets DP that did not interact with the laser beam LR2 in some embodiments. Also, FIGS. 6A and 6B show the droplet catcher 85 that receives the multiple target droplets DP that did not interact. In some embodiments, as will be described with respect to FIGS. 6A and 6B, the nozzle 117 of the droplet generator 115 generates multiple target droplets DP in parallel, e.g., parallel target droplets DP. The parallel target droplets DP may have a diameter in a range from about 10 microns (μm) to about 22 μm. The parallel target droplets DP are ejected through the nozzle 117 and into the zone of excitation ZE at a speed in a range from about 10 meters per second (m/s) to about 100 m/s in various embodiments.

The excitation laser source 300 generates the ionizing laser beam LR2, which is a pulsed beam in some embodiments. The laser pulses of the ionizing laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength between 8 μm and 15 μm in an embodiment. The laser beam LR0 generated by the excitation laser source 300 is guided by the laser guide optics 320 and focused, by the focusing apparatus 330, into the ionizing laser beam LR2 that is introduced into the EUV radiation source 100. In some embodiments, in addition to $CO_2$ and Nd:YAG lasers, the ionizing laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 is also generated by the excitation laser source 300 and the non-ionizing laser beam LR1 is also focused by the focusing apparatus 330. In some embodiments, as will be described with respect to FIGS. 6A and 6B, the ionizing laser beam LR2 is divided into two portions of the laser beam LR2 that reach the zone of excitation ZE from two different angles and thus interact at the zone of excitation ZE to generate a first group of multiple parallel bright fringes at the zone of excitation ZE. At the zone of excitation ZE, each one of the parallel target droplets DP interact, in parallel, with one of the first group of multiple parallel bright fringes to become ionized and to produce EUV radiation.

In some embodiments, the laser source 300 generates the ionizing laser beam LR2 and the non-ionizing laser beam LR1 as pulses. In such embodiments, the non-ionizing laser beam LR1 is a pre-heat laser pulse (interchangeably referred to herein as the "pre-pulse) that is used to heat (or pre-heat) a given target droplet to create a low-density target plume with multiple smaller droplets, which is subsequently heated (or reheated) by a pulse from the ionizing laser beam LR2 (e.g., main pulse), generating increased emission of EUV light compared to when the pre-heat laser pulse is not used.

In some embodiments, as will be described with respect to FIGS. 6A and 6B, the non-ionizing laser beam LR1 is also divided into two portions of laser beam LR1 that reach a location slightly before the zone of excitation ZE from two different angles and thus interact at the location slightly before the zone of excitation ZE to generate a second group of multiple parallel bright fringes. In some embodiments, as will be described with respect to FIGS. 6A and 6B, each one of the parallel target droplets DP, interact with one of the second group of multiple parallel bright fringes to get heated and to create the low-density target plume before reaching the zone of excitation ZE. As noted, the laser source 300 generates the laser beams LR1 and LR2 in some embodiments. The laser beam LR1 generates the second group of multiple parallel bright fringes and the laser LR2 generates the first group of multiple parallel bright fringes. In some embodiments, the laser source 300 includes a laser source for generating the laser beam LR2 and also includes another laser source for generating the laser beam LR1. In some embodiments, the laser beam LR0 includes both non-ionizing laser light and ionizing laser light that are generated by the excitation laser source 300 and the laser generator 310. In some embodiments, as described with respect to FIGS. 3B and 7B, the laser guide optics 320 and the focusing apparatus 330 sends the ionizing laser beam LR2 and the non-ionizing laser beam LR1 through separate pairs of slits in the collector mirror 110 to the zone of excitation ZE to generate the first and second group of multiple parallel bright fringes. The second group of multiple parallel bright fringes are generated slightly above the first group of multiple parallel bright fringes.

In various embodiments, the pre-heat non-ionizing laser beam LR1 generates the second group of multiple parallel bright fringes having a width of between about 300 μm to about 500 μm and the ionizing laser beam LR2 generates the first group of multiple parallel bright fringes having a width between about 300 μm to about 500 μm. In some embodiments, the pre-heat non-ionizing laser beam LR1 and the ionizing laser beam LR2 have a pulse-duration in the range from about 10 ns to about 50 ns, and a pulse-frequency in the range from about 1 kHz to about 100 kHz. In various embodiments, the pre-heat laser and the excitation laser have an average power in the range from about 1 kilowatt (kW) to about 50 kW. The pulse-frequency of the non-ionizing laser beam LR1 and the ionizing laser beam LR2 are matched with the ejection-frequency of the target droplets DP in an embodiment.

The ionizing laser beam LR2 is directed through openings (or lenses) into the zone of excitation ZE. The openings adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse of the non-ionizing laser beam LR1 and the main pulse of the ionizing laser beam LR2 is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector mirror 110, an EUV collector mirror, further reflects and focuses the EUV radiation for the lithography exposing processes performed through the exposure device 200. In some embodiments, as will be described with respect to FIGS. 3A, 3B, 4, and 5, the openings may be one or more pairs of slits such that the two portions of the non-ionizing laser beam LR1 and/or the two portions of the ionizing laser beam LR2 enter from a pair of slits. As described, the interaction of the two portions of the ionizing laser beam LR2 generates the first group of multiple parallel bright fringes at the zone of excitation ZE and the interaction of the two portions of the non-ionizing laser beam LR1 generates the second group of multiple parallel bright fringes slightly before the zone of excitation ZE in some embodiments.

One method of synchronizing the generation of a pulse (either or both of the pre-pulse and the main pulse) from the excitation laser with the arrival of the target droplet in the zone of excitation ZE is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp}=d/(t_{rad}-t_o)$$ Equation (1).

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized. The timing and the duration of the pre-pulse and/or the main pulse when the first and/or the second group of multiple parallel bright fringe are generated are described below with respect to FIGS. 6A and 6B.

As shown in FIG. 1, a buffer gas is supplied from a first buffer gas supply 130 through the opening in collector mirror 110 by which the ionizing laser beam LR2 and/or the non-ionizing laser beam LR1 is delivered to the tin droplets. In some embodiments, the buffer gas is $H_2$, He, Ar, N or another inert gas. In certain embodiments, $H_2$ is used as the buffer gas, as H radicals that are generated by ionization of the buffer gas can be used for cleaning purposes. The buffer gas can also be provided through one or more second buffer gas supplies 135 toward the collector mirror 110 and/or around the edges of the collector mirror 110. Further, the chamber 105 includes one or more gas outlets 140 so that the buffer gas is exhausted outside the chamber 105. Hydrogen gas has low absorption to the EUV radiation. Hydrogen gas reaching to the coating surface of the collector mirror 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the gas outlet 140. However, it is difficult to exhaust all gaseous $SnH_4$ from the chamber and to prevent the $SnH_4$ from entering the exposure device 200. Therefore, monitoring and/or control of the debris in the EUV radiation source 100 is beneficial to the performance of the EUVL system.

Figure 2:
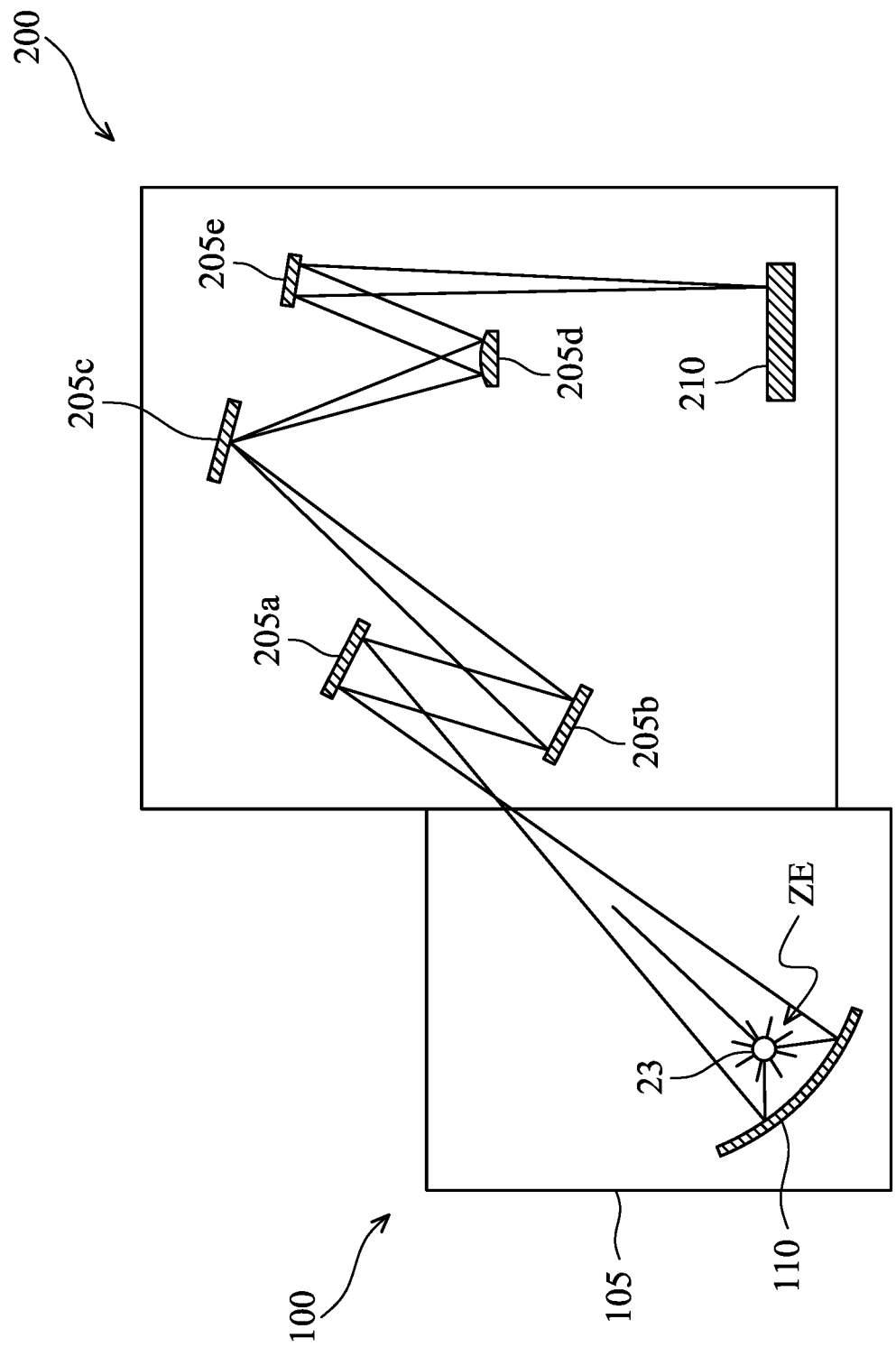
FIG. 2 illustrates a schematic view of an EUV lithography exposure tool.

FIG. 2 shows a schematic view of an EUV lithography exposure tool. The EUVL exposure tool of FIG. 2 includes the exposure device 200 that shows the exposure of photoresist coated substrate, a target semiconductor substrate 210, with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle, e.g., a reflective mask 205c, with a beam of EUV light, to produce a patterned beam, and one or more reduction projection optics 205d, 205e, for projecting the patterned beam onto the target semiconductor substrate 210. A mechanical assembly (not shown) may be provided for generating a controlled relative movement between the target semiconductor substrate 210 and patterning optic, e.g., the reflective mask 205c. As further shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target semiconductor substrate 210. In some embodiments, the first and second group of multiple parallel bright fringes are in a small area of about 500 μm by about 500 μm in the zone of excitation ZE of FIG. 2 and the collector mirror 110 is adjusted such that the EUV radiation generated in the EUV radiation source 100 is gathered and focused by the collector mirror 110 and is transmitted outside the EUV radiation source 100 to the one or more optics 205a, 205b.

Figure 3B:
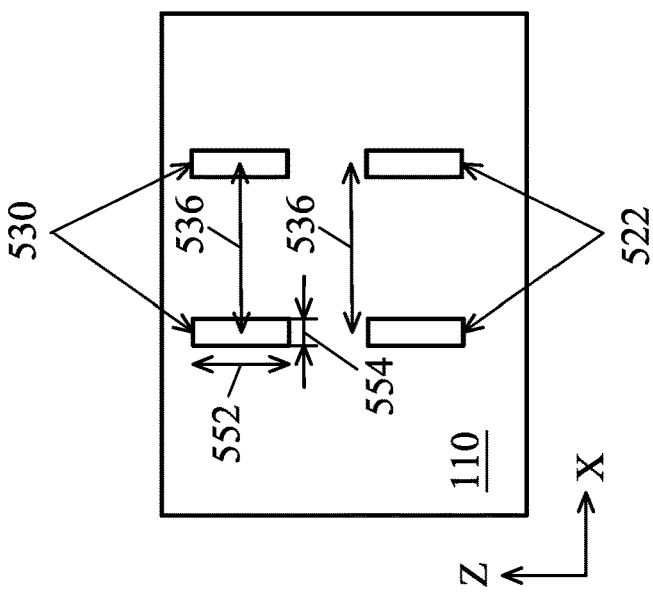
FIGS. 3A and 3B illustrate optical systems of the EUV radiation source for generating a pattern of bright and dark fringes in accordance with some embodiments of the present disclosure.
Figure 3A:
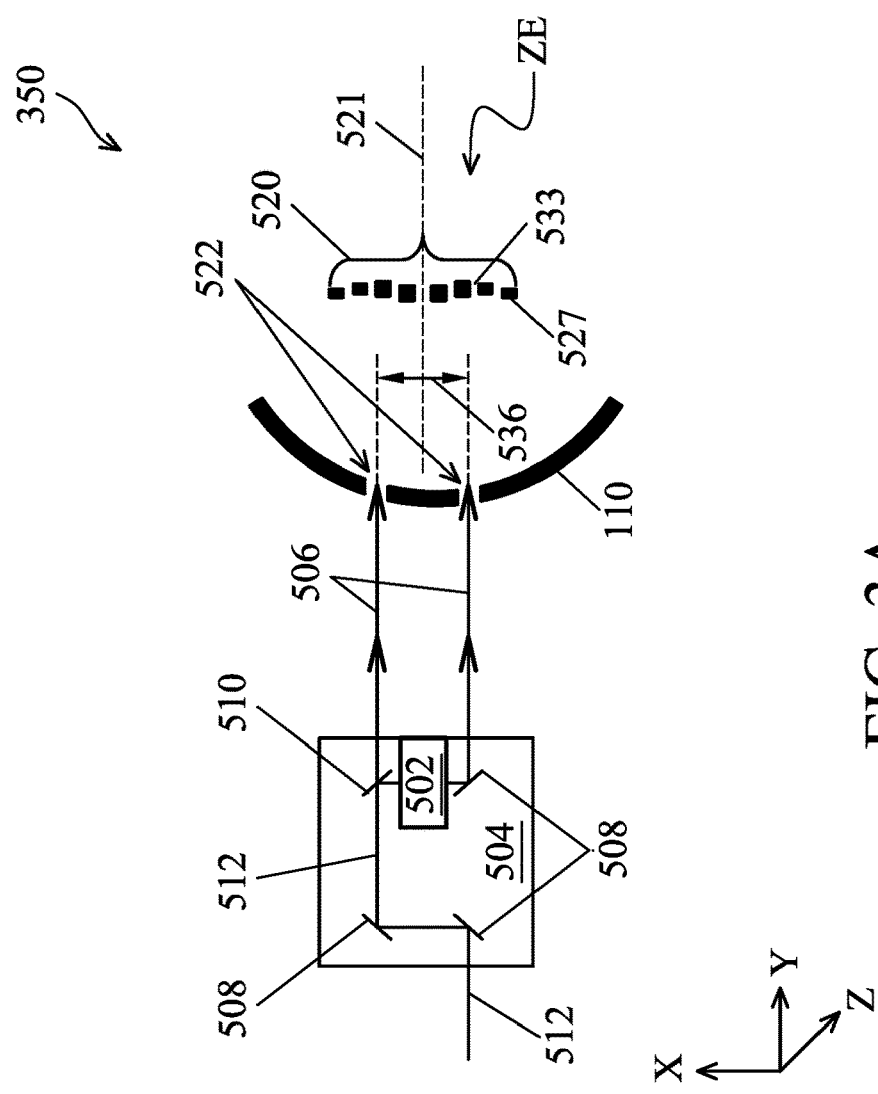

FIGS. 3A and 3B illustrate optical systems of the EUV radiation source for generating a pattern of bright and dark fringes in accordance with some embodiments of the present disclosure. In some embodiments, the optical system 350 of FIG. 3A is implemented in the EUV radiation source 100 of FIG. 1 and uses the laser beam LR0 generated by the excitation laser source 300 to generate the pattern of bright and dark fringes in the zone of excitation ZE of the EUV radiation source 100.

FIG. 3A shows a plan view in the XY-plane of an optical system 350 that receives a laser beam 512 that is consistent with the laser beam LR0 of FIG. 1. The laser beam 512 enters a mirror system 504 that includes a beam splitter 510 and three mirrors 508, e.g., 45 degree mirrors. The mirror system 504 divides the laser beam 512 into two laser beams 506, a pair of laser beams 506, having similar, e.g., essentially equal, intensity. The pair of laser beams 506 pass through a pair of slits 522 in the collector mirror 110 and generate a pattern of bright and dark fringes 520 having fringes 527 in the excitation zone ZE in front of the slits 522 in the XZ-plane. As shown in FIG. 3A, the pair of laser beams 506 do not travel the same distance to reach the zone of excitation ZE and, thus, a bright fringe 527 may not occur at a midline 521, e.g., a symmetry line, between the pair of slits 522. In some embodiments, the laser beam 512 is consistent with the laser beam LR2 or laser beam LR1 of FIG. 1. In some embodiments, the laser beam 512 is consistent with the laser beam 506 or laser beam 606 of FIGS. 6A, 6B, 7A, and 7B.

In some embodiments, as shown in FIG. 3A, a delay segment 502 is introduced in the path of one of the laser beams 506 to generate a delay in one of the laser beams 506 and, thus, move the bright and dark fringes. In some embodiments, the delay segment 502 generates a delay such that the laser beams 506 are in-phase and, thus, a bright fringe 527 is generated at the midline 521 in the zone of excitation ZE. In some embodiments, the delay segment 502 generates a delay such that the laser beams 506 are 180 degrees out of phase and, thus, a dark fringe 533 is generated at the midline 521 in the zone of excitation ZE. In some embodiments, the pair of slits 522 are rectangular openings in the collector mirror 110. In some embodiments, a distance 536, in the X-direction, between the center of slits 522 is between about 0.5 mm to about 10 mm. The slits are described in more details with respect to FIG. 3B. As shown in FIG. 3A, the collector mirror 110 is a cross-section of the collector mirror and, thus, the pattern of bright and dark fringes 520 extend in the Z-direction that is perpendicular to the XY-plane of FIG. 3A.

FIG. 3B shows two pair of slits 522 and 530 in the collector mirror 110. FIG. 3B is a plan view of the collector mirror 110 that is perpendicular to the Y-direction. As shown, the pair of slits 530 is arranged on top of the pair of slits 522 in the Z-directions. As described, the collector mirror 110 may have an elliptical or a parabolic shape to direct the generated EUV radiation from the EUV radiation source 100. In some embodiments, each slit of the pairs of slits has a rectangular shape with a width 554 and a length 552 and the distance 536 separating the centers of the slits in the X-direction. In some embodiments, the slits of each pair of slits have similar shape and size, while the slits of the pair of slits 522 and slits of the pair of slits 530 have a different shape and/or size. In some embodiments, the laser beam LR2 is divided by the mirror system 504 into a pair of laser beams that passes through the pair of slits 522 and creates a pattern of bright and dark fringes in the zone of excitation ZE. In some embodiments, the laser beam LR1 is divided by another mirror system (not shown) into a pair of laser beams that passes through the pair of slits 530 and creates a pattern of bright and dark fringes in the zone of excitation ZE. In some embodiments, the laser beam LR2 creates a first pattern of bright and dark fringes in the zone of excitation ZE and the laser beam LR1 creates a second pattern of bright and dark fringes in the zone of excitation ZE, which is above the first pattern of bright and dark fringes. Thus, two non-overlapping patterns of bright and dark fringes may be created one on top of the other by the laser beams LR1 and LR2 at the zone of excitation ZE. In some embodiments, the distance 536 is between about 0.5 mm and about 10 mm. The width 554 is between about 200 nm and about 10 μm, and the length 552 is between about 100 μm and about 1 mm. In some embodiments, the length 552 and the width 554 of the pair of slits 522 and 530 are the same, however, the distance 536 between of the two pair of slits 522 and 530 are not the same because the wavelength of the laser beams LR1 and LR2 are not the same. In some embodiments, the distance 536 between the slits of the pairs of slits 530 is adjusted by the ratio of the wavelength of the laser beams LR2 to LR1 such that both of the first and second group of multiple parallel bright fringes generated by the laser beams LR2 to LR1 have the same effective width of the fringes and the same effective distance between adjacent fringes.

FIG. 4 illustrates an optical system of the EUV radiation source for generating a pattern of bright and dark fringes in accordance with some embodiments of the present disclosure. FIG. 4 shows an optical system 400 that receives the laser beams 506 of FIG. 3A. The laser beams 506 enter the slits 522 in the collector mirror 110 and generate the pattern of bright and dark fringes 520 over a line 538 at the zone of excitation ZE along the X-direction. An intensity variation of the pattern of bright and dark fringes 520 is shown by curve 523. In some embodiments, as shown in FIG. 4, the curve 523 has maxima and minima. The curve 523 has a maximum at point A where the midline 521 intersects the line 538 at the zone of excitation ZE. In some embodiments, the laser beams 506 entering the pair of slits 522 are in-phase and, thus, the beams of light reaching point A from the pair of slits 522 remain in-phase and constructively add at point A to generate a maximum at point A. In some embodiments, the distance 536 between the slits is between 200 nm and 100 cm. In some embodiments, the pair of slits 522 are next to each other and an angle θ between the incident beams is between 0.5 degrees and 5 degrees. In some embodiments, the slits 522 are at opposite sides of the collector mirror 110 and the angle θ between the incident beams is between 175 degrees and 179.5 degrees.

Similarly, the laser beams 506 entering the pair of slits 522 travel the paths 546 and 540 to reach a point B the line 538 at the zone of excitation ZE. In some embodiments, the paths 546 and 540 have a travel path difference 531, which is shown by a perpendicular line 544 from the upper slit 522 to the path 540 in FIG. 4. The travel path difference 531 is equal to one or more wavelengths, e.g., one wavelength, of the laser beams 506. Thus, the beams of light reaching point B from the pair of slits 522 remain in-phase and constructively add at point B to generate a maximum at point B. In some embodiments, a length 534 between point A and point B is equal to the wavelength of the laser beams 506 multiplied by a ratio of a distance 532 over the distance 536. The distance 532 is a distance between the collector mirror 110 and the zone of excitation ZE in the Y-direction and the distance 536 is the distance between the slits 522 of the collector mirror 110 in the X-direction. Conversely, the laser beams 506 entering the pair of slits 522, destructively add at point C between the points A and B and, thus, a minimum is generated at point C. In some embodiments, as shown in FIG. 4, the curve 523 has cosine squared shape and, as shown, the bright fringe 527 is centered around a maximum point of the curve 523 and the dark fringe 533 is centered around a minimum point of the curve 523.

FIG. 5 illustrates a pattern of bright and dark fringes generated by an optical system in accordance with some embodiments of the present disclosure. FIG. 5 shows the pattern of bright and dark fringes 520 at the zone of excitation ZE and also shows the bright fringes 527 and the dark fringes 533. In some embodiments, the pattern of bright and dark fringes 520 extends along the line 538 in the X-direction in a width 519. In some embodiments, each fringe of the pattern of bright and dark fringes 520 extends along a line perpendicular to the line 538, e.g., in the Z-direction, in a length 525. As shown in FIG. 4, the length 534 is a sum of the widths of a bright fringe 527 and a dark fringe 533 and, thus, the width of each one the bright fringes 527 and the width of each one of the dark fringes 533 is half of the length 534. In some embodiments, the length of the bright fringes 527 shrinks as the bright fringes 527 are further away from the center of the pattern of bright and dark fringes 520. In some embodiments, when the slits 522 have a rectangular shape in the XZ-plane, the pattern of bright and dark fringes 520 has a 2D sinc-function envelope in the XZ-plane at the zone of excitation ZE. Thus, the pattern of bright and dark fringes 520 is a 2D cosine squared function that changes in the X-direction and is limited by a main lobe of the 2D sinc-function in some embodiments. In some embodiments, the length 525 of the fringes decrease as the fringe gets farther from the central fringe. Thus, the fringes farther from the central fringe do not have the effective length such that when the droplet DP passes through the fringe enough energy of the laser beams LR1 or LR2 is transferred to the droplet DP. Thus, the length 525 of the fringes defines the number of parallel droplets that simultaneously pass through the fringes.

In some embodiments, the width 519 of the pattern of bright and dark fringes 520 is inversely proportional to the width 554 of the pair of slits 522 and the length 525 of the pattern of bright and dark fringes 520 is inversely proportional to the length 552 of the pair of slits 522. In some embodiments, the 2D sinc-function has other less intense lobes in the X-direction and the Z-direction and thus other patterns of bright and dark fringes repeat, with less intensity, right, left, above, and below the pattern of bright and dark fringes 520 and at least a portion of the other patterns of bright and dark fringes is not visible. In some embodiments, a frequency of the fringes of the pattern of bright and dark fringes 520, e.g., the frequency of the cosine squared function, is proportional to the distance 536 between the center of the pair of slits 522. In some embodiments, the fringes in a lobe between the droplet generator 115 and the pattern of bright and dark fringes 520 is used for pre-heating the droplets DP.

FIGS. 6A and 6B illustrate an EUV radiation source for generating plasma from multiple droplets using multiple fringes in accordance with some embodiments of the present disclosure. FIGS. 6A and 6B show the droplet generator 115 having the nozzle 117 that simultaneously produces multiple droplets DP in parallel. FIG. 6A shows the non-ionizing laser beam LR1 that passes through a mirror system consistent with the mirror system 504 of FIG. 3A generates the pair of laser beams 606. In addition, the pair of laser beams 606 passes through a pair of slits consistent with the pair of slits 530 of FIG. 3B and generates a pattern of bright and dark fringes 535 having fringes 537 at the zone of excitation ZE. When reaching the excitation zone ZE, the multiple parallel droplets DP pass through the pattern of bright and dark fringes 535 and thus a pancake-shaped droplet 27 is generated from each one of the multiple droplets DP. As shown in FIG. 6A, each one of the multiple droplets DP pass through one of the bright fringes 537 of the pattern of bright and dark fringes 535.

FIG. 6A also shows the ionizing laser beam LR2 that passes through a mirror system consistent with the mirror system 504 of FIG. 3A generates the pair of laser beams 506. In addition, the pair of laser beams 506 passes through a pair of slits consistent with the pair of slits 522 of FIG. 3B and generates the pattern of bright and dark fringes 520 at the zone of excitation ZE. The pancake-shaped droplets 27 pass through the pattern of bright and dark fringes 520 such that each pancake-shaped droplet 27 passes through one of the bright fringes 527 of the pattern of bright and dark fringes 520. Passing through the bright fringes 527, each pancake-shaped droplet 27 interacts with the bright fringes 527 at the zone of excitation ZE in the chamber of the EUVL system to form the plasma plume 23 which emits EUV light rays 24 in all directions. In some embodiments, the multiple droplets DP simultaneously interact at the excitation zone ZE by the multiple bright fringes 527 that are generated by the ionizing laser beam LR2 to produce the plasma plume 23 which emits EUV light rays 24 in all directions.

FIG. 6B shows the pair of laser beams 506 passes through a pair of slits consistent with the pair of slits 522 of FIG. 3B in the collector mirror 110 and generates the pattern of bright and dark fringes 520 at the zone of excitation ZE. The multiple droplets DP pass through the pattern of bright and dark fringes 520 such that each droplet DP passes through one of the bright fringes 527 of the pattern of bright and dark fringes 520. Passing through the bright fringes 527, droplets DP interact with the bright fringes 527 at the zone of excitation ZE in the chamber of the EUVL system to form the plasma plume 23 which emits EUV light rays 24 in all directions.

As shown in FIGS. 6A and 6B, each one of the multiple droplets DP receives the laser energy when passing through the bright fringes and thus receives laser energy for a longer amount of time compared to the amount of time the droplet DP receives the laser energy in the EUV radiation source 100 of FIG. 1. Thus, although the ionizing laser beam LR2 is divided into fringes in FIGS. 6A and 6B, by irradiating multiple droplets DP simultaneously and receiving the laser energy for a longer time, the efficiency of the EUV radiation source of FIGS. 6A and 6B is greater than the efficiency of the EUV radiation source 100 of FIG. 1 for transferring the laser energy into EUV radiation.

In some embodiments, as shown in an EUV source 650 of FIG. 6B one or more droplet illumination modules (DIM) 610A, 610B, 610C, or 610D irradiates the zone of excitation ZE with non-ionizing light to illuminate the droplets DP. In addition, one or more droplet detection module (DDM) 620A, 620B, 620C, or 620D take images of the zone of excitation ZE to determine, e.g., calculate, the velocity of the multiple droplets DP and to determine the timing of the laser pulses that generate the ionizing laser beam LR2 and the timing of the laser pulses that generate the non-ionizing laser beam LR1 such that the pattern of bright and dark fringes 520/535 is generated when the multiple droplets DP/pancake-shaped droplets 27 are respectively traveling through the pattern of bright and dark fringes 520/535. In some embodiments, the DIM 610A transmits an illumination radiation beam 640 to the zone of excitation ZE and the DDM 620A receives a reflectance beam 645 from the zone of excitation ZE.

In some embodiments, the collector mirror 110 is modified, e.g., adjusted, such that the interactions that generates the plasma plumes 23, which emits EUV light rays 24 from each one of the multiple droplets DP, in the zone of excitation ZE and the EUV light rays 24 are gathered and directed by the collector mirror 110 to the exposure device 200. In some embodiments, the pattern of bright and dark fringes 520 occurs in the zone of excitation ZE and the zone of excitation ZE is at or sufficiently around a focal point of the collector mirror 110. In some embodiments, the collector mirror 110 is adjusted to improve the efficiency of the collector mirror 110 for gathering and focusing the generated EUV radiation. In some embodiments, a size of the multiple droplets DP in FIGS. 6A and 6B is reduced compared to the size of the droplet DP in FIG. 1, and thus, the droplets of FIGS. 6A and 6B produce the plasma plume 23 using less laser energy compared to producing the plasma plume 23 in FIG. 1. In some embodiments, as noted, the size of the multiple droplet DP is between about 10 μm to about 22 μm. In some embodiments, the size and the number of the multiple parallel droplets DP are adjusted such that EUV radiation of 250 Watts is generated.

Figure 7A:
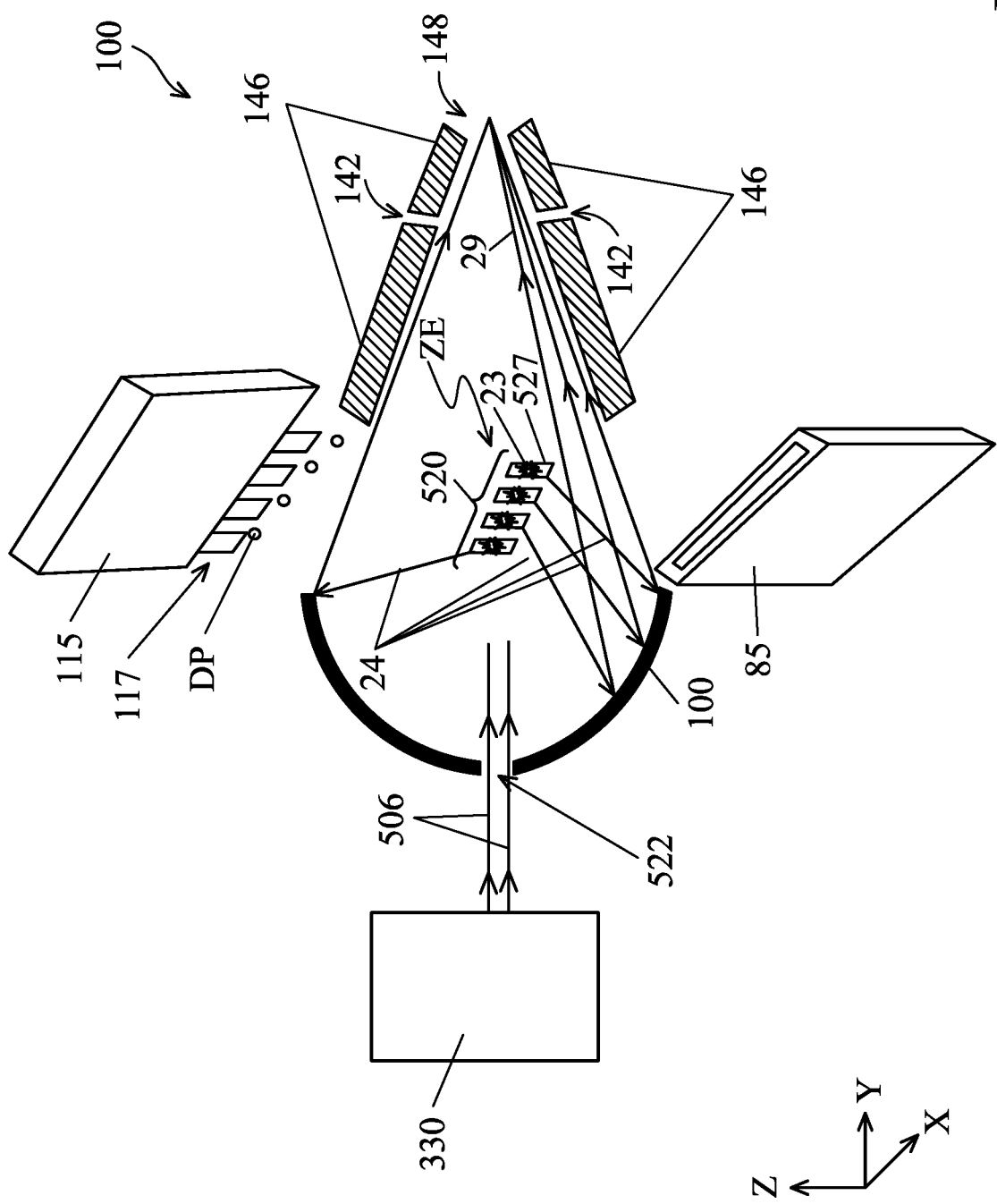
FIGS. 7A and 7B illustrate the EUV radiation source for generating EUV radiation from multiple droplets in accordance with some embodiments of the present disclosure.
Figure 7B:
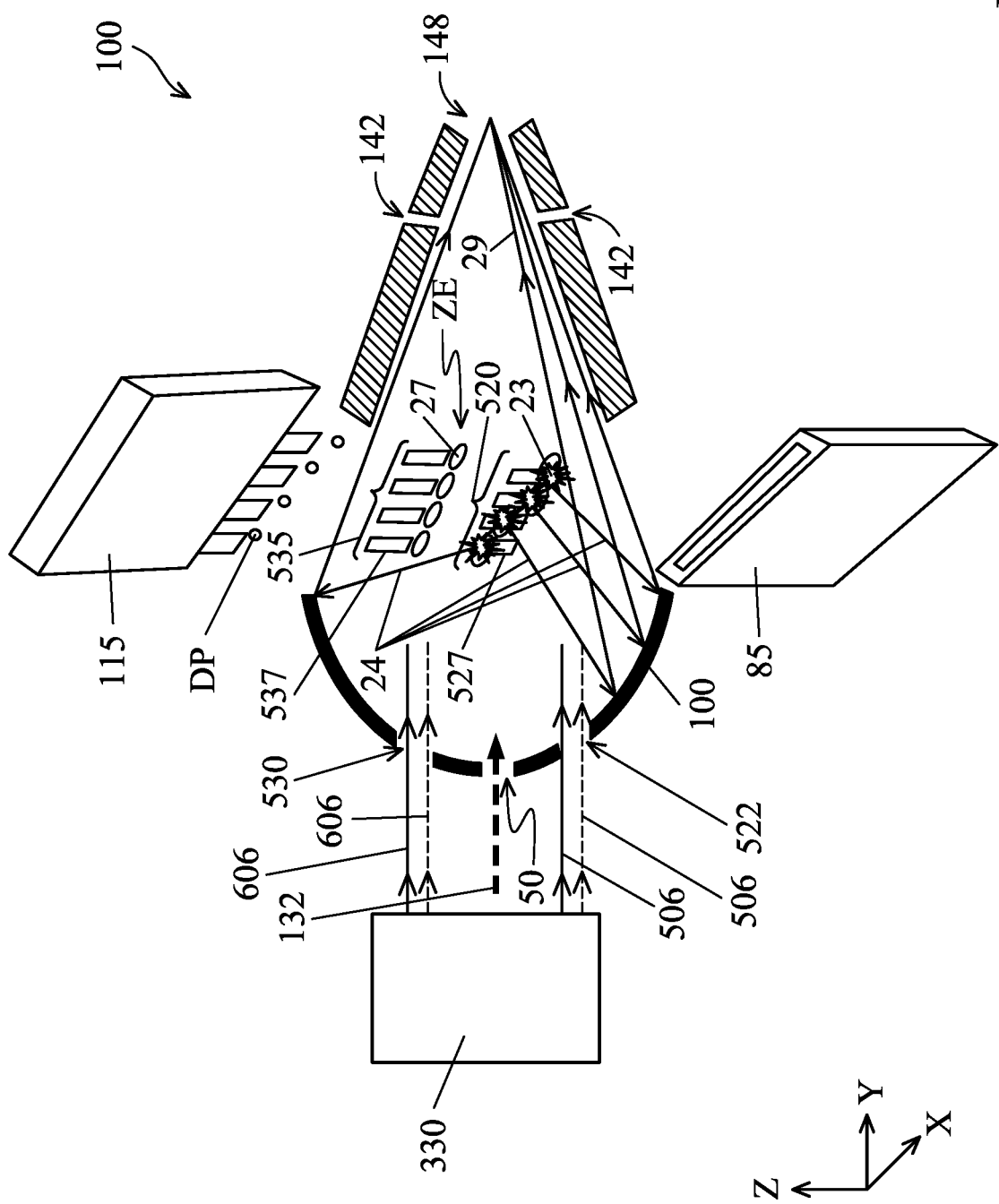

FIGS. 7A and 7B illustrate the EUV radiation source for generating EUV radiation from multiple droplets in accordance with some embodiments of the present disclosure. FIG. 7A shows the details of the droplet generator 115 of FIG. 1 that has the nozzle 117 that simultaneously produces multiple droplets DP from multiple adjacent openings, e.g., in parallel. The ionizing laser beam LR2 is divided into the pair of laser beams 506 by a mirror system consistent with the mirror system 504 of FIG. 3A. The pair of laser beams 506 pass through the pair of slits 522 of the collector mirror 110 and produce the pattern of bright and dark fringes 520 in an XZ-plane in front of the pair of slits 522 in the zone of excitation ZE. The multiple droplets DP pass through the plane of the pattern of bright and dark fringes 520 such that each DP passes through one bright fringe 527 of the pattern of bright and dark fringes 520 receiving the laser beam energy from the bright fringe and producing the plasma plumes 23 that generate the EUV light rays 24 (EUV radiation). The droplet catcher 85 is configured to receive the debris droplets associated with the multiple droplets DP.

In some embodiments, the collector mirror 110 collects and directs the generated EUV light rays 24 to the opening 148 of the EUV radiation source 100. In some embodiments, the ionizing laser beam LR2 interacts with the tin droplets DP at the zone of excitation ZE in a space between collector mirror 110 and the walls 146 of EUV radiation source 100 to form the plasma plume 23 which emits EUV light rays 24 in all directions. The walls 146 are used to create a cone shape such that the EUV radiation along arrows 29 inside the cone shape exit through the opening 148 and any other radiation that is not along the arrows 29 do not exit the cone shape and thus do not exit the EUV radiation source 100.

FIG. 7B also shows the droplet generator 115 that has the nozzle 117 that simultaneously produces multiple droplets DP from multiple adjacent openings in parallel. The ionizing laser beam LR2 is divided into the pair of laser beams 506 by a mirror system consistent with the mirror system 504 of FIG. 3A. The pair of laser beams 506 pass through the pair of slits 522 of the collector mirror 110 and produce the pattern of bright and dark fringes 520 in an XZ-plane in front of the pair of slits 522 in the zone of excitation ZE. The pre-heat non-ionizing laser beam LR1 is divided into the pair of laser beams 606 by a mirror system consistent with the mirror system 504 of FIG. 3A. The pair of laser beams 606 pass through the pair of slits 530 of the collector mirror 110 and produce the pattern of bright and dark fringes 535 in an XZ-plane in front of the pair of slits 530. In some embodiments, the pattern of bright and dark fringes 535 and the pattern of bright and dark fringes 520 are non-overlapping and occur in the same XZ-plane in the zone of excitation ZE. In some embodiments, an opening 50 of the collector mirror 110 is used for a gas flow 132 to enter into the EUV radiation source 100. In some embodiments, at least a portion of the gas flow 132 exits through openings 142 in the wall 146 of the cone shape.

As described with respect to FIG. 6A, the multiple droplets DP pass through the plane of the pattern of bright and dark fringes 535 and 520 such that each DP first passes through one bright fringe 537 of the pattern of bright and dark fringes 535, receives the laser beam energy from the bright fringe 537, and produces the pancake-shaped droplets 27. Then the pancake-shaped droplets 27 each passes through one bright fringe 527 of the pattern of bright and dark fringes 520, receives the laser beam energy from the bright fringe 527, and produces the plasma plumes 23 that produce the EUV light rays 24 (EUV radiation). Thus, the multiple droplets DP first pass through the bright fringes 537 of the pattern of bright and dark fringes 535, receive the pre-heat non-ionizing energy of the laser beam LR1, and produce the pancake-shaped droplets 27. Then, the pancake-shaped droplets 27 pass through the bright fringes 527 of the pattern of bright and dark fringes 520, receive the ionizing energy of the laser beam LR2 and produce the plasma plumes 23 that generate the EUV light rays 24. In some embodiments, the collector mirror 110 collects and directs the generated EUV light rays 24 to the opening 148 of the EUV radiation source 100. In some embodiments, the size of the droplets DP, the number of parallel droplets DP, and the distance between the parallel droplets are designed such that during each pulse of the laser beams LR1 and LR2, the multiple droplets DP simultaneously pass through the first group of multiple parallel bright fringes 537 to produce the pancake-shaped droplets 27. The pancake-shaped droplets 27 simultaneously pass through the second group of multiple parallel bright fringes 527 to generate EUV radiation while the droplets DP and the pancake-shaped droplets 27 are inside the fringes. In some embodiments, the effective width of a fringe is half of the distance 536 and the effective distance between fringes is also half of the distance 536.

Figure 8:
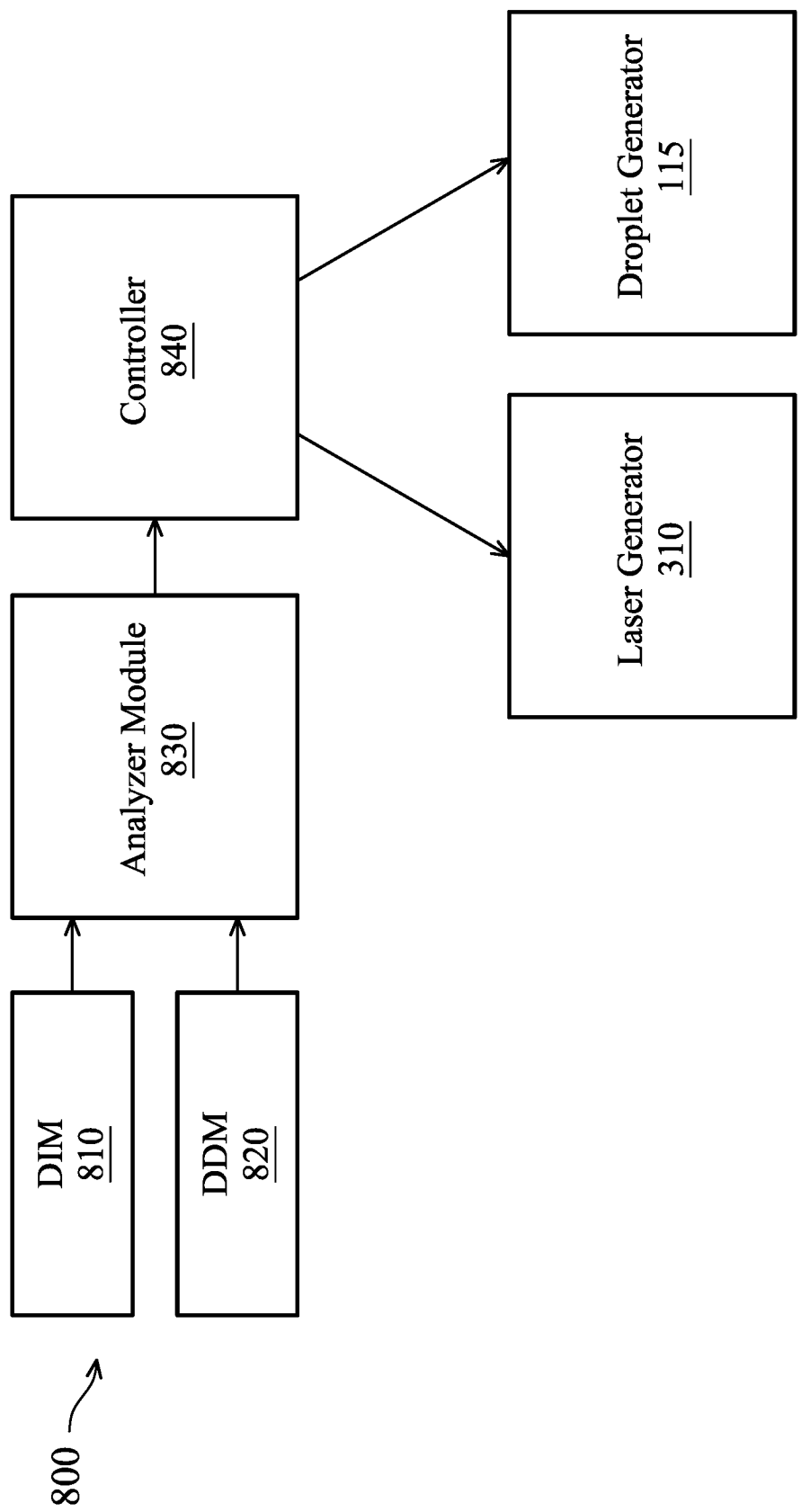
FIG. 8 schematically illustrates an exemplary EUV lithography system for generating EUV radiation from multiple droplets in accordance with some embodiments of the disclosure.

FIG. 8 schematically illustrates an exemplary EUV lithography system for generating EUV radiation from multiple droplets DP in accordance with some embodiments of the disclosure. The EUV lithography system 800 includes an analyzer module 830 and a controller 840 coupled to each other. The analyzer module 830 receives the images of the droplets DP through the DDM 820 that is consistent with one of the DDMS 620A, 620B, 620C, or 620D and determines, e.g., calculates, a timing of the laser generator 310 to generate the later pulses that generate the pattern of bright and dark fringes 520 and 535 based on the location of the multiple droplets DP. The analyzer module 830 may command the laser generator 310 through the controller 840. In some embodiments, based on the a timing of the laser generator 310, the analyzer module 830 commands the droplet generator 115 through the controller 840 to eject the droplets DP. In some embodiments, the analyzer module 830 commands the DIM 810 that is consistent with one of the DIMS 610A, 610B, 610C, or 610D to irradiate by non-ionizing light the zone of excitation ZE to illuminate the droplets DP.

Figure 9A:
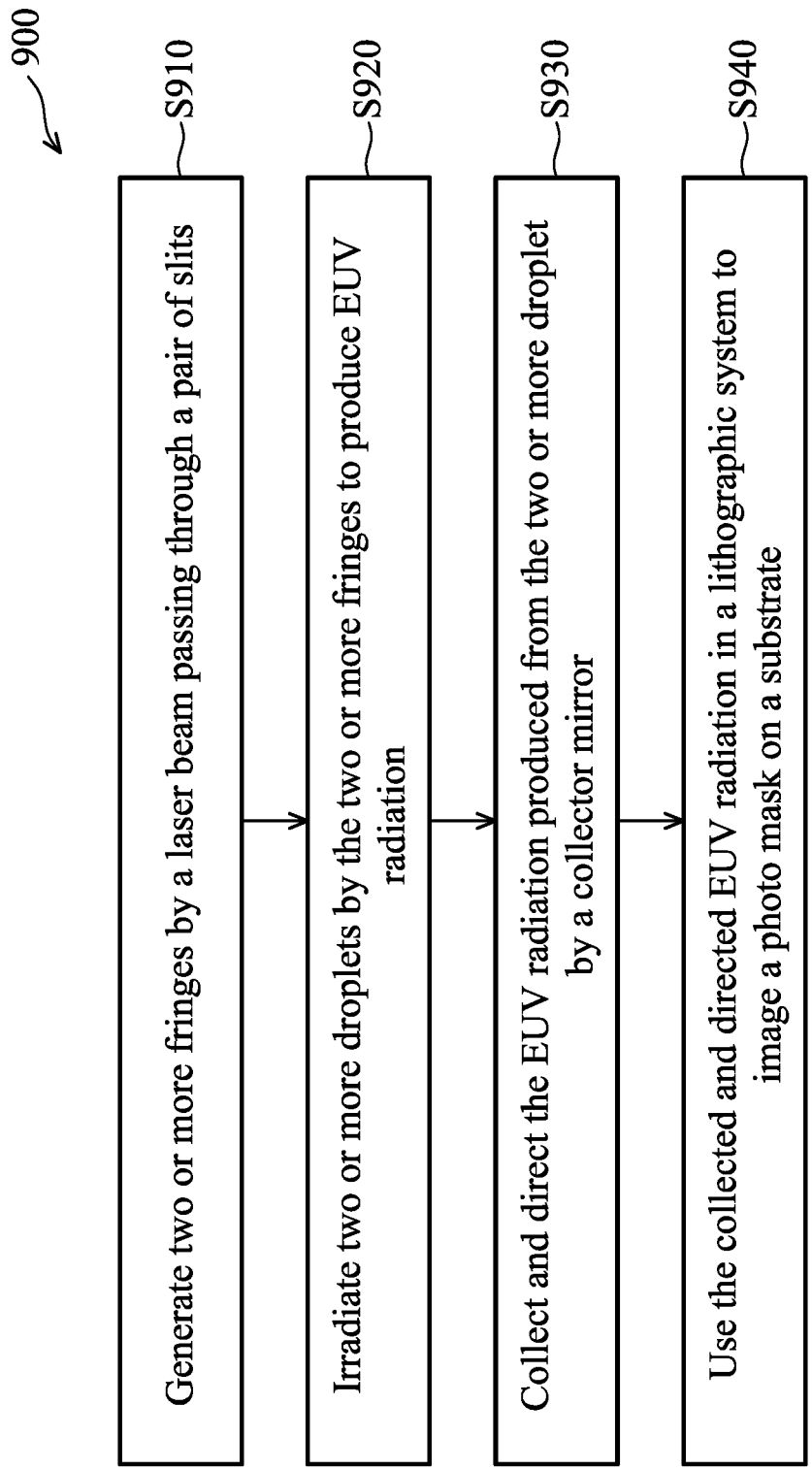
FIGS. 9A and 9B illustrate flow diagrams of an exemplary processes for generating EUV radiation from multiple droplets in accordance with some embodiments of the disclosure.
Figure 9B:
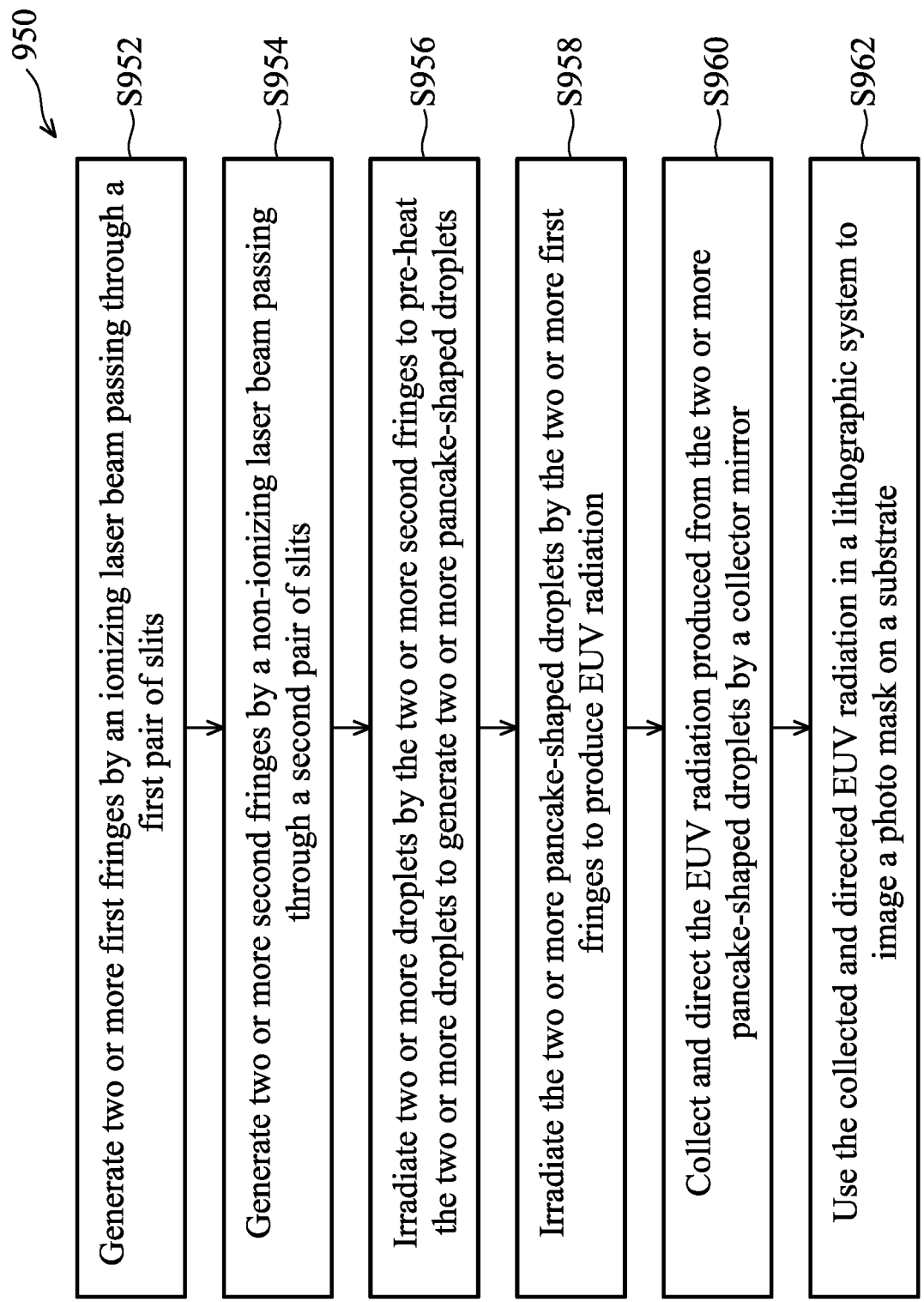

FIGS. 9A and 9B illustrate flow diagrams of an exemplary processes for generating EUV radiation from multiple droplets in accordance with some embodiments of the disclosure. The process 900 of FIG. 9A may be performed by EUV lithography system of FIGS. 1 and 8 and use the EUV radiation sources of 6A, 6B, 7A, 7B. In some embodiments, the process 900 or a portion of the process 900 is performed and/or is controlled by the computer system 1000 described below with respect to FIGS. 10A and 10B. The method includes the operation S910 of generating two or more fringes by a laser beam passing through a pair of slits. As shown in FIG. 7A, the ionizing laser beams 506 pass through the pair of slits 522 and the pattern of bright and dark fringes 520 is generated. In operation S920, two or more droplets DP are irradiated by the two or more bright fringes 527 of the pattern of bright and dark fringes 520 to produce EUV radiation. As shown in FIG. 7A, the droplets DP pass through the bright fringes 527 and are irradiated by the ionizing laser beam 506 and the EUV light rays 24 (EUV radiation) are produced. In operation S930, the EUV radiation produced from the two or more droplets DP is collected and directed by a collector mirror. As shown in FIG. 7A, the EUV light rays 24 are collected and directed by the collector mirror 110 to the opening 148 of FIG. 7A. In operation S940, the collected and directed EUV radiation is used in a lithographic system, e.g., the system of FIG. 2, to image a photo mask, e.g., the reflective mask 205c of FIG. 2 on a substrate, e.g., the target semiconductor substrate 210.

The process 950 of FIG. 9B may be performed by EUV lithography system of FIGS. 1 and 8 and use the EUV radiation sources of 6B and 7B. In some embodiments, the process 950 or a portion of the process 950 is performed and/or is controlled by the computer system 1000 described below with respect to FIGS. 10A and 10B. The method includes the operation S952 of generating two or more first fringes by an ionizing laser beam passing through a first pair of slits. As shown in FIG. 7B, the ionizing laser beams 506 pass through the pair of slits 522 and the two or more first bright fringes 527 of the pattern of bright and dark fringes 520 are generated in the zone of excitation ZE. In operation 954, two or more second fringes are generated by a non-ionizing laser beam passing through a second pair of slits. As shown in FIG. 7B, the non-ionizing laser beams 606 pass through the pair of slits 530 and the two or more second bright fringes 537 of the pattern of bright and dark fringes 535 are generated are generated in the zone of excitation ZE.

In operation S956, two or more droplets DP are irradiated by the two or more second bright fringes 537 of the pattern of bright and dark fringes 535 to pre-heat the two or more droplets DP to generate two or more pancaked-shaped droplets 27. In operation S958, the two or pancaked-shaped droplets 27 are irradiated by the two or more first bright fringes 527 of the pattern of bright and dark fringes 520 to produce EUV radiation. In operation S960, the EUV radiation produced from the two or more pancaked-shape droplets 27 is collected and directed by a collector mirror. As shown in FIG. 7A, the EUV light rays 24 are collected and directed by the collector mirror 110 to the opening 148 of FIG. 7B. In operation S962, the collected and directed EUV radiation is used in a lithographic system, e.g., the system of FIG. 2, to image a photo mask, e.g., the reflective mask 205c of FIG. 2 on a substrate, e.g., target semiconductor substrate 210.

FIGS. 10A and 10B illustrate a computer system for an apparatus for generating EUV radiation from multiple droplets in accordance with some embodiments of the disclosure. FIG. 10A is a schematic view of a computer system 1000 that executes the process for generating EUV radiation from multiple droplets according to one or more embodiments as described above. All of or a part of the processes, method and/or operations of the foregoing embodiments can be realized using computer hardware and computer programs executed thereon. In some embodiments, the computer system 1000 provides the functionality of the controller 840, the analyzer module 830 of FIG. 8. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors 1011, such as a micro-processor unit (MPU), a ROM 1012 in which a program such as a boot up program is stored, a random access memory (RAM) 1013 that is connected to the processors 1011 and in which a command of an application program is temporarily stored and a temporary storage area is provided, a hard disk 1014 in which an application program, a system program, and data are stored, and a bus 1015 that connects the processors 1011, the ROM 1012, and the like. Note that the computer 1001 may include a network card (not shown) for providing a connection to a LAN.

The program for causing the computer system 1000 to execute the process for generating EUV radiation from multiple droplets in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the process for manufacturing the lithographic mask of a semiconductor device in the foregoing embodiments. The program may only include a command portion to call an appropriate function (module) in a controlled mode and obtain desired results.

According to some embodiments of the present disclosure, a method for generating EUV radiation includes simultaneously irradiating two or more target droplets with a first laser beam in an EUV radiation source apparatus to produce EUV radiation. The method also includes collecting and directing the EUV radiation produced from the two or more target droplets by an imaging mirror. In an embodiment, the method further includes configuring a droplet generator to release the two or more target droplets in first parallel lines in a first plane. In an embodiment, the method further includes dividing the first laser beam into two portions, interfering the two portions of the first laser beam to produce two or more fringes, and irradiating each one of the two or more target droplets with one of the two or more fringes. In an embodiment, the method further includes configuring the two portions of the first laser beam to pass through a pair of slits to generate the two or more fringes. In an embodiment, the method further includes generating the two or more fringes in the first plane. The two or more fringes are in parallel with the first parallel lines, and configuring each one of the two or more target droplets to simultaneously pass through a separate fringe of the two or more fringes. In an embodiment, the first plane is perpendicular to a direction of the first laser beam and the method further includes using the collected and directed EUV radiation in a lithographic system to image a photo mask on a substrate. In an embodiment, the method further includes dividing the first laser beam into three or more portions, interfering the three or more portions of the first laser beam to produce the two or more fringes, and irradiating each one of the two or more target droplets with one of the two or more fringes. In an embodiment, the method further includes generating a plasma plume by irradiating the two or more target droplets with the two or more fringes of the first laser beam. The EUV radiation is generated by the plasma plume. In an embodiment, the method further includes configuring the two portions of the first laser beam to pass through different path lengths, and generating a shift of a location of the two or more fringes by the different path lengths. In an embodiment, the method further includes simultaneously pre-heating the two or more target droplets with a second laser beam in the EUV radiation source, and generating a pancake-shaped droplet by the pre-heating. The pre-heating is before the irradiating the two or more target droplets with a first laser beam.

According to some embodiments of the present disclosure, a method of for generating EUV radiation includes generating two or more fringes by a first laser beam passing through a first pair of slits. The method includes irradiating two or more target droplets by the two or more fringes to produce EUV radiation. Each one of the two or more target droplets simultaneously pass one of the two or more fringes. The method also includes collecting and directing the EUV radiation produced from the two or more target droplets by an imaging mirror. In an embodiment, the method further includes dividing the first laser beam into two portions, and interfering the two portions of the first laser beam to produce the two or more fringes. In an embodiment, the method further includes generating a plasma plume by irradiating the two or more target droplets with the two or more fringes of the first laser beam. The EUV radiation is generated by the plasma plume. In an embodiment, the method further includes configuring a droplet generator to simultaneously release the two or more target droplets.

According to some embodiments of the present disclosure, An EUV radiation source includes a first laser source configured to generate a first laser beam and a collector mirror having two or more slits. The radiation source includes a droplet generator configured to simultaneously release two or more target droplets in first parallel lines in a first plane. The radiation source also includes an optical system configured to divide the first laser beam into two or more portions and to pass the two or more portions of the first laser beam through the two or more slits to generate two or more first fringes in parallel with a path of the two or more target droplets. The radiation source includes a controller coupled to and controlling the first laser source and the droplet generator. The controller is configured to fire a laser pulse of the first laser source to irradiate the simultaneously released two or more target droplets by the two or more first fringes. Each first fringe irradiates one droplet. In an embodiment, the optical system of the EUV radiation source includes a lens configured to generate a collimated beam of the first laser beam. The collimated beam is configured to impinge on the two or more slits. In an embodiment, the slits have a rectangular shape. In an embodiment, the EUV radiation source further includes a second laser source configured to generate a second pre-heat laser beam. The optical system is further configured to divide the second pre-heat laser beam into two or more portions and to pass the two or more portions of the second pre-heat laser beam through the two or more slits to generate two or more second fringes in parallel with a path of the two or more target droplets. In an embodiment, the optical system is configured to generate a first number of first fringes that is equal to a second number of second fringes and the first number of first fringes and the second number of second fringes are between 2 and 8, generate the two or more first fringes at a zone of excitation, and generate the two or more second fringes in a path of the two or more target droplets from the droplet generator to the zone of excitation and before the zone of excitation. In an embodiment, the EUV radiation source further includes a droplet illumination module configured to irradiate the zone of excitation with non-ionizing light to illuminate the two or more target droplets, and a droplet detection module configured to capture images from the zone of excitation to determine a velocity of the two or more target droplets and to determine, based on the velocity, a timing of turning the first and second laser sources on and off.

In some embodiments, implementing the processes and methods mentioned above, increases the efficiency of generating the EUV radiation by simultaneously irradiating multiple droplets.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation source, comprising:
   a laser source configured to generate an excitation laser beam;
   a beam splitter configure to device the excitation laser beam into two laser beams;
   a collector mirror comprising two openings, through which the two laser beams pass, respectively; and
   a droplet generator including multiple nozzles configured to simultaneously release multiple droplets in parallel,
   wherein the EUV radiation source is configured such that the two laser beams generate parallel bright fringes at a zone of excitation and the multiple droplets are irradiated by the bright fringes.

2. The EUV radiation source of claim 1, wherein the excitation laser beam is a pre-pulse laser.

3. The EUV radiation source of claim 1, wherein the excitation laser beam is a main-pulse laser.

4. The EUV radiation source of claim 1, wherein the two openings are two slits, and a distance between centers of two slits is in a range from 0.5 mm to 10 mm.

5. The EUV radiation source of claim 4, wherein a width of each of the two slits is in a range from 200 nm to 10 μm.

6. The EUV radiation source of claim 1, wherein the EUV radiation source is configured such that the two laser beams are in phase when passing through the two openings.

7. The EUV radiation source of claim 1, wherein a number of multiple droplet is in a range from 2 to 8.

8. An extreme ultraviolet (EUV) radiation source, comprising:
   a laser source configured to generate a pre-pulse laser beam and a main-pulse laser beam;
   a collector mirror comprising a first pair of slits; and
   a droplet generator including multiple nozzles configured to simultaneously release multiple droplets in parallel,
   wherein the extreme ultraviolet (EUV) radiation source is configured such that at least one of the pre-pulse laser beam or the main-pulse laser beam passes through the pair of slit to cause bright fringes at a zone of excitation by interference, and the multiple droplets are irradiated by the bright fringes.

9. The EUV radiation source of claim 8, further comprising multiple droplet illumination modules to illuminate the multiple droplets, respectively.

10. The EUV radiation source of claim 9, further comprising multiple droplet detection modules to acquire reflected images of the multiple droplets, respectively.

11. The EUV radiation source of claim 10, further comprising a controller configured to control the laser source and the droplet generator based on a detection result of the droplet detection modules.

12. The EUV radiation source of claim 8, wherein a distance between centers of the first pair of slits is in a range from 200 nm to 10 cm.

13. The EUV radiation source of claim 8, further comprising a second pair of slits.

14. The EUV radiation source of claim 13, wherein the EUV radiation source is configured such that the pre-pulse laser beam passes through the first pair of slits and the main-pulse laser beam passes through the second pair of slits.

15. The EUV radiation source of claim 14, wherein:
   a wavelength of the pre-pulse laser beam is different from a wavelength of the main-pulse laser beam, and
   a slit width of the first pair of slits is different from a slit width of the second pair of slits.

16. A pattern formation method comprising:
   generating one or more laser beams;

causing the one or more laser beams to generate bright fringes at a zone of excitation by interference;

generating multiple target droplet simultaneously;

generating an extreme ultraviolet (EUV) light by irradiating the multiple target droplet with the bight fringes generated by the one or more laser beams;

collecting the EUV light by a collector mirror;

directing the EUV light to a photomask; and exposing a photoresist layer with the EUV light reflected by the photomask.

17. The pattern formation method of claim 16, wherein one laser beam passes through a pair of slits provided to the collector mirror to cause the interference.

18. The pattern formation method of claim 16, wherein two laser beam passes through two openings provided to the collector mirror to cause the interference.

19. The pattern formation method of claim 16, wherein:
one or more laser beams include a pre-pulse laser beam and a main-pulse laser beam, and
the pre-pulse laser beam and the main-pulse laser beam generate the bright fringes, respectively.

20. The pattern formation method of claim 19, wherein a location of the fringes generated by the pre-pulse laser beam is different from a location of the fringes generated by the main-pulse laser beam in a direction along which the multiple target droplets travel.

* * * * *